United States Patent
Krawczyk et al.

(10) Patent No.: US 6,831,524 B1
(45) Date of Patent: Dec. 14, 2004

(54) FEED FORWARD VOLTAGE CONTROLLED RING OSCILLATOR

(75) Inventors: Thomas W. Krawczyk, Troy, NY (US); John F. McDonald, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/950,932

(22) Filed: Sep. 12, 2001

Related U.S. Application Data

(60) Provisional application No. 60/232,025, filed on Sep. 12, 2000.

(51) Int. Cl.[7] ............................................. H03B 27/00
(52) U.S. Cl. ......................................... 331/57; 331/74
(58) Field of Search ............................. 331/57, 177 R, 331/74

(56) References Cited

U.S. PATENT DOCUMENTS

| | | | |
|---|---|---|---|
| 4,963,767 A | 10/1990 | Sinh | |
| 5,475,344 A | 12/1995 | Maneatis et al. | |
| 5,592,126 A | 1/1997 | Boudewijns et al. | |
| 5,841,325 A | 11/1998 | Knotts et al. | |
| 6,005,448 A | * 12/1999 | Pickering et al. | ............. 331/57 |

OTHER PUBLICATIONS

Peter M. Campbell et al., "A Very–Wide Bandwidth Digital VCO Implemented in GaAs HBTs Using Frequency Multiplication and Division," *17th Annual GaAs IC Symposium Technical Digest*, pp. 311–314, Oct. 1995.

Richard C. Walker et al., "A 10Gb/s Si–Bipolar TX/RX Chipset for Computer Data Transmission," *IEEE International Solid–State Circuits Conference*, pp. 19.1/1–19.1/11, 1998.

* cited by examiner

*Primary Examiner*—Arnold Kinkead
(74) *Attorney, Agent, or Firm*—Wolf, Greenfield & Sacks, P.C.

(57) ABSTRACT

According to one embodiment of the invention, a ring oscillator is provided that includes a number of stages, each of the stages being coupled to an output of at least two previous stages. This architecture is referred to hereinafter as a "feed forward" architecture, as signals are fed forward to further stages beyond a consecutive stage. Any number of stages may be used. This architecture represents a new topology for ring oscillator design, as ring oscillators generally include consecutive stages that each have an input from the previous stage only. In general, such an architecture achieves higher frequencies than oscillators without feed forward paths.

18 Claims, 3 Drawing Sheets

FEED FORWARD VOLTAGE CONTROLLED RING OSCILLATOR

RELATED APPLICATIONS

This application claims the benefit under Title 35 U.S.C. §119(e) of co-pending U.S. Provisional Application Ser. No. 60/232,025 filed Sep. 12, 2000, entitled "FEED FORWARD VOLTAGE CONTROLLED RING OSCILLATOR", by T. Krawczyk, and J. McDonald, the contents of the aforementioned application is incorporated herein by reference in its entirety.

FIELD OF THE INVENTION

The field of the invention relates generally to oscillator circuits, and more particularly to voltage-controlled ring oscillators used for high-frequency communications.

BACKGROUND OF THE RELATED ART

The current high-growth nature of digital communications demands higher speed serial communication circuits. Present day technologies barely manage to keep up with the present need to communicate at high speeds, e.g. gigabit, terabit, and higher transmission speeds. New techniques are needed to ensure that methods for serial communication can continue to expand and grow.

Multiplexers are typically used in communication systems to multiplex lower rate data signals onto a higher rate channel. Examples of communication systems include optical communication systems (e.g. SONET communication systems) which multiplex multiple data streams onto a single channel in a serial manner. Other communication system types also use multiplexers, such as communication devices that operate in LANs, internal communication systems of a computer system, processors of a multiprocessor system, and the like.

Oscillators are used in communication systems to provide clocking signals used for transmitting data. In particular, ring oscillators have been used as part of an output retiming circuit of a serial communication system to clock data.

SUMMARY OF THE INVENTION

According to one embodiment of the invention, a ring oscillator is provided that includes a number of stages, each of the stages being coupled to an output of at least two previous stages. This architecture is referred to hereinafter as a "feed forward" architecture, as signals are fed forward to further stages beyond a consecutive stage. Any number of stages may be used. This architecture represents a new topology for ring oscillator design, as ring oscillators generally include consecutive stages that each have an input from the previous stage only. In general, such an architecture achieves higher frequencies than oscillators without feed forward paths.

For example, a ring oscillator according to one aspect of the invention may contains four stages, each stage having an input derived from the outputs of the previous two stages. This configuration increases the maximum frequency of operation over conventional ring oscillators by 50%. Variable delay in such a configuration may be achieved, for example, through a voltage-controlled weighting of previously generated signals. Frequency may be controlled by varying a delay through each stage, and the delay of each stage may depend, for example, on a variable weighting between the two previous stages' outputs. Such a ring oscillator consumes as much power as a conventional four stage ring oscillator, yet operates a higher frequencies and with less noise due to averaging effects.

In particular, a Feed Forward Interpolated Voltage Controlled Oscillator (FFI VCO), is an improvement over the standard ring oscillator design. First, the design is versatile and adjustments can be made to center frequency, tuning range, and gain, through simple parameter changes. Second, configured for maximum operating speed, it is significantly faster than a simple four stage ring oscillator utilizing the same power. This increase in speed can be traded for additional phase noise and jitter suppression. A reduction in phase noise makes an FFI VCO according to various aspects of the invention a viable alternative to LC tanks when used in short-haul communication channel.

According to one aspect of the present invention, a feed forward oscillator according to various embodiments of the invention may be part of a communication system having a serial data transmission circuit. More particularly, there are conventional serial data transmission circuits that utilize an output retiming circuit, and require clocking at the same frequency as the output bit rate. At bit rates above, for example, 10 Gb/s, this conventional method becomes prohibitive, because of the lack of Voltage Controlled Oscillators (VCOs) capable of operating at this speed. According to one aspect of the invention, a serial data transmission circuit may implement a symmetric multiplexer with a ring oscillator according to various aspects of the present invention to transmit data. The multi-phase nature of ring oscillators enables the serial data transmission circuit to use a clock frequency, for example, of one-quarter the 20 Gb/s bit rate, or 5 GHz. This example communication technique implements two signals in quadrature from a VCO.

According to one aspect of the invention, an oscillator is provided comprising a plurality of buffer stages, each of which having an output that is coupled to inputs of at least two respective buffer stages of the plurality of buffer stages. According to one embodiment of the invention, at least one of the buffer stages includes an input from a first previous stage and an input from a second previous stage arranged previous with respect to the first previous stage. According to one embodiment of the invention, the oscillator further comprises a control for adjusting a delay in at least one of the plurality of buffer stages. According to one embodiment of the invention, the oscillator includes four buffer stages. According to one embodiment of the invention, the control includes varying a weighting between the input from the first previous stage and the input from the second previous stage. According to one embodiment of the invention, an adjustment of delay produces an adjustment in output frequency of the oscillator.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

The invention is pointed out with particularity in the appended claims. The above and further advantages of this invention may be better understood by referring to the following description when taken in conjunction with the accompanying drawings in which similar reference numbers indicate the same or similar elements.

In the drawings.

DETAILED DESCRIPTION

Figure 1:
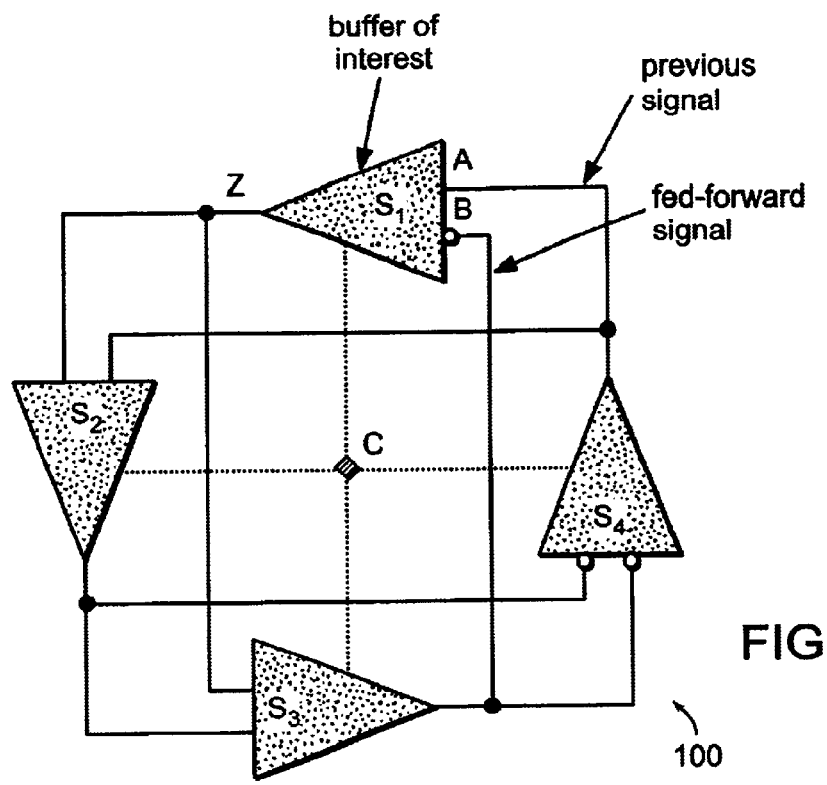
FIG. 1 is a block diagram showing an oscillator architecture according to one embodiment of the invention.

According to one aspect of the invention, a new architecture is provided for ring oscillator design. FIG. 1 is a block diagram showing one ring oscillator architecture according to one embodiment of the invention. More particularly, ring oscillator 100 includes a number of buffer stages $S_1$–$S_4$ coupled by signal paths. The output of each stage is routed to one or more stages in front of itself. For example, as shown in FIG. 1, the output Z of stage $S_1$ is coupled to two stages ($S_2$ and $S_3$) in front of $S_1$ along the oscillator ring. Likewise, each of the other ring oscillator stages receives inputs from two stages behind it. Through controlled interpolation of these two input signals, each stage can adjust its delay, and thus the frequency of the oscillation. To clarify, variable delay is achieved by interpolating the output of the previous stage and the output of the next previous stage (a stage located before the previous stage). In the case where the oscillator has four stages, the slowest frequency is achieved when the weighting favors the previous signal only, and the system operates as a four-stage oscillator. Maximum frequency for the oscillator is achieved when the weighting favors the fed-forward signal, and the system operates as a two-stage oscillator.

It should be appreciated that, although only four stages are shown in FIG. 1, any number of stages may be used. Also, it should be understood that, although FIG. 1 shows signals being fed forward to the following two consecutive stages, any signal may be fed forward to further stages.

Figure 2:
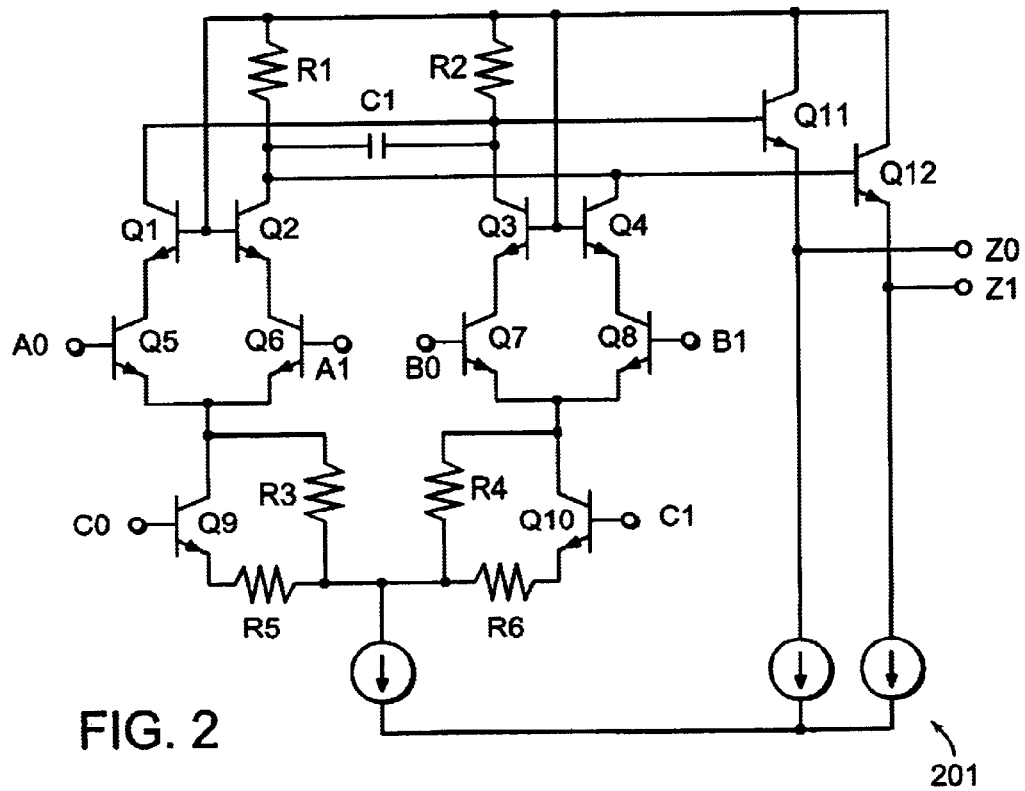
FIG. 2 is a schematic diagram showing a circuit detail of one of the stages of an oscillator according to one embodiment of the invention.

One embodiment of a feed-forward oscillator, shown in FIG. 1, is a four-stage ring oscillator in which stage controls its delay by linearly interpolating the signals from the previous two stages. The current, which remains that same through the tree, is gradually shifted between the two inputs, A and B, as shown in FIG. 2 discussed further below. The A (previous) input arrives from one stage back, and the B (leap) input arrives from the stage prior to that. The two signals are weighted by the control signal, C, and summed by the common pull-up resistors as shown in FIG. 2.

The minimum operating frequency of the oscillator is defined by the oscillation of the system when the leap signal is ignored, and only the previous signal is used. In this case, the system is running as a four-stage oscillator and has a minimum nominal frequency. When the control voltage is switched in the other direction, the leap signal is used, and the previous stage's output is ignored. In this configuration the system is running as two separate two-stage ring oscillators with a frequency of approximately twice that of the four-stage oscillator.

The effective delay of a stage is defined as the delay of a stage in a four-stage oscillator possessing the same frequency as the feed-forward oscillator. This parameter can be found by setting the intrinsic delay of a stage to T, setting s equal to the weighting factor between 0 and 1 (0 for only the previous signal, and 1 for only the fed forward signal), and looking at the output transition times of stages n, n−1, and n−2. The transition time of stage n is the intrinsic delay through the stage, plus the weighted sum of the previous two stages $$t_n = T + st_{n-2} + (1-s)t_{n-1} \tag{1}$$

Solving for the time difference between two stages yields the effective delay and the frequency of the VCO in terms of the effective and intrinsic delay of each stage $$T_{\mathit{eff}} = t_n - t_{n-1} = \frac{T}{(1+s)} \tag{2}$$

$$f_{vco} = \frac{1}{8T_{\mathit{eff}}} = \frac{(1+s)}{8T} \tag{3}$$

The factor of eight is necessary because two complete cycles through four stages equal one period of the feed-forward oscillator.

For s equal to 0, the effective delay is equal to the intrinsic delay of the stage. At the other extreme, when s equals 1, the effective delay is one half of the intrinsic delay. This follows because the system now has two stages rather then four.

Circuit Design

FIG. 2 shows one schematic representation of a single stage 201 according to one embodiment of the invention. For example, stage 201 may constitute one or more buffer stages of oscillator 100. Input A is accepted on the bases of transistors Q5, Q6, and input B is accepted on the bases of transistors Q7, and Q8. Inputs A and B are coupled to outputs of previous stages. The output Z of single stage 201, can be taken before or after the emitter follower, at the base or emitter of transistors Q11 and Q12. Control input C on the bases of transistors Q9 and Q10 may be used as a control input. More particularly, control C may be used to switch the current between differential pair A and differential pair B. With common pull-up resistors, R1 and R2, inputs A and B are averaged with a weighting defined by the differential voltage C. Output is then taken from the voltage across resistors, R1 and R2.

Resistors R5 and R6, couple with the emitter resistances of Q9 and Q10 and decrease the gain and linearize differential amplifier C. Resistor R3, and R4, provide a current path around the differential amplifier, C to prevent a complete switching of current through differential amplifier C and to prevent a complete switching of current through differential pair A and B. Capacitor C1 degrades the performance of the circuit in order to increase the overall delay of the stage. Transistors Q1, Q2, Q3, and Q4 are common base amplifiers which improve the output characteristics of the circuit.

The voltage controlled delay element used in the FFI VCO is shown in FIG. 2 and includes a two-level fully differential CML tree with common pull-up resistors, a top-level cascode amplifier, and emitter follower outputs. In order to maintain consistent phase differences between phases, loading is identical on all four stages. Loading per element consists of two other elements in the ring and an external minimum sized buffer. Emitter widths of 4 μm were chosen for all devices as this yielded a good compromise between speed and power. Current through the circuit was maintained by an active current source sinking 3.2 mA, the collector current at the peak $f_T$. The collector resistors, R1 and R2, are 100 Ω, and yield a conservative voltage swing of 320 mV.

The collector capacitor introduces a mechanism to reduce the delay of the gate and adjust the center frequency. The center frequency, when s=0, is related to the $R_C C_C$ time constant and (3) by $$f_1 = \frac{3}{16(T_o + \ln(2)(2R_1 C_1))} \tag{4}$$

where $T_0$ is the nominal delay through the gate when $C_1$ is removed, and the factor of 0.7 compensates for the differential switching time. With a nominal stage delay of 25 ps, found through simulation, $C_1$ was set to 76 fF, yielding a center frequency of 5.27 GHz.

Bypass resistors, R3 and R4$_b$, are introduced to prevent a fill switch of current between the lowest level branches of the CML tree. This is meant to reduce the effects of stage decoupling, which are discussed in detail in the following section. The resistor acts to bypass current around the completely off transistor equal to $$i_{bypass} = \frac{V_{bc}}{R3} \tag{5}$$

Simulations and analysis show a wide margin of safety when s is dept below 0.85. This yields bypass resistors of approximately 1.6 kΩ.

Resistors, R5 and R6 added below the emitters of the bottom differential level increase the transconductance of the amplifier to 8.0 mA/N from a nominal 0.5 mA/N. With a current source of 3.2 mA, this corresponds to a differential voltage swing of 400 mV for a full current switch.

Cascode amplifiers were added at the top of the tree in order to present a lower load resistance to the differential amplifiers. This aids the driving ability and reduces the phase noise of the gate.

The oscillator may be carefully laid out to ensure symmetry and close proximity between stages. This additional care ensures that common mode noise sources such as from substrate and supply appear as a common mode source. In addition, all inter-stage interconnect as well as the interconnect from the VCO to the four loads were matched.

Jitter

Jitter in a ring VCO is generated within each variable delay element from four primary noise sources: thermal noise of the collector resistors, tail current noise, sampling of input noise by switching of differential pair, and noise at the VCO input. [4] k is used as a time domain figure of merit relating to standard distribution of a transition versus a fixed time between that transition and a fixed transition before it. A breakdown of how each noise source contributes to the overall k is described in [4].

Due to the nature of frequency control in this VCO there is little effect on the noise generating elements in the delay element. Thermal noise from the collector resistors remains constant since the capacitance and resistance remain the same. Noise introduced by the degenerate tail current source also remains fixed. The input differential pair noise is dependent on the current through the pair which is linearly switched between the inputs. Since the total current remains constant the total noise contribution from each pair will remain approximately constant. For these reasons the jitter introduced by one stage remains constant over all frequencies.

Although jitter per stage remains the same the total jitter per transition depends strongly on the transition interpolating ability of the VCO. When the VCO is operating in the four stage mode the jitter in one period is a result of the jitter from all four stages. However, as the weighting factor is shifted to favor the lept signal the jitter introduced during a full period is only from two stage elements rather than four. The result is that k varies according to $$k = \frac{\sigma_x}{(1+s)\sqrt{\Delta T \frac{\omega}{\omega_0}}} \tag{6}$$

The factor of $\omega/\omega_0$ is because we want to look at the same number of transitions independent of the frequency. Replacing the weighting factor, s, with $$s \approx \frac{2\omega}{3\omega_0} - 1 \tag{7}$$

and substituting in (6) yields $$k \approx \frac{2}{3}\left(\frac{\omega}{\omega_0}\right)^{2/3} k_0 \tag{8}$$

wherein $k_0$ is the nominal jitter constant for an identical ring oscillator without feed-forward interpolation, $\omega_0$ is the center frequency and $\Delta T$ is the time over which the open loop jitter is being measured.

Using the derivation in [4] yields a $k_0$ of 22 nVs. Through calculation and simulation it was found that the largest contributor to overall noise was from the input differential pairs.

Stage Decoupling

A problem exists in the FFI VCO if the weighting factor, s, is increased to its maximum value of 1. In this case, the n-th stage, only uses the signal from the (n-2) stage, and thus operates as two independent two-stage oscillators. Any mismatch in stage delay will cause the two rings to become decoupled.

The model used to analyze this situation uses an ideal FFI VCO in which one stage has a delay different than the other three stages. This can be a result of a layout imbalance, loading effects, process variations, or from signal noise. Although this derivation is not a completely accurate model of the effect it provides a conservative solution that can be used in preventing stage decoupling.

The stage transfer functions are equal to $$t_n - 1 = T + St_n - 3 + (1-s)t_n - 2 \tag{9}$$

$$t_n = T + st_n - 2 + (1-s)t_n - 1 + \sigma \text{ for all n a factor of 4} \tag{10}$$

$$t_n + 1 = T + st_n - 1 + (1-s)t_n \tag{11}$$

The loop is represented mathematically as an open loop chain with an infinite number of stages. The transition time of the n-th stage in the chain is represented by $t_n$. Stage $t_n$ in this case receives the additional delay of $\sigma$. The next step is to look at the time between successive outputs from any one stage or more exactly the period of the loop, $$t_{n+4} - t_n = \frac{(4T + \sigma)}{s+1} \tag{12}$$

This is simply the sum of the effective delays of the four stages. (16) is the same for all stages, even though N only occurs in stage a, under the condition that stage decoupling has not occurred. Solving for the time difference between the output of stage $t_n$ and the output of stage $t_{n+1}$ using (9) through (12), yields the effective delays $$t_n - t_{n-1} = \frac{T}{s+1} + \frac{\sigma}{1-s^4} \quad (13)$$

$$t_{n+1} - t_n = \frac{T}{s+1} - \frac{s\sigma}{1-s^4} \quad (14)$$

$$t_{n+2} - t_{n+1} = \frac{T}{s+1} + \frac{s^2\sigma}{1-s^4} \quad (15)$$

$$t_{n+3} - t_{n+2} = \frac{T}{s+1} - \frac{s^3\sigma}{1-s^4} \quad (16)$$

Stage decoupling, where the effective delay goes to zero, can occur when the weighting factor is too high. This is because the VCO acts as two independent 2 stage oscillators instead of one 4 stage oscillator.

These equations are in the form of the effective delay plus a factor for the unbalanced delay N. The delay between stages increase or decrease rapidly as s approaches 1. This divergence is expected because the sum of the four delays must equal the total delay. Each stage is affected by the additional delay, but when analyzing stage decoupling it is only necessary to look at $t_n-t_{n-1}$ stage. This is because this delay is the most seriously affected of all the delays because it is relative to the output of the stage with the additional delay included, and because the equation decreases the most rapidly. The condition when stage decoupling occurs is when the delay goes to 0 resulting in the output of stage $t_n$ coincides with the output of stage $t_{n-1}$. Although the equations are continuous at this point, reasonable operation dictates that stage output times should be sequential.

In (13) we set the delay equal to 0 and solve for σ/T.

$$\frac{\sigma}{T} = 1 - s + s^2 - s^3 \quad (17)$$

yielding the highest tolerable additional delay for stage decoupling give s. As the injected delay increases, the point at which stage decoupling occurs departs from the maximum value of 1.

The effect of stage decoupling is clearly a problem and results in a VCO that operates as two independent oscillators. To avoid this problem, the weighting factor should be limited based upon a maximum expected delay injection from noise sources and parameter variations. For this very conservative implementation s was limited to about 80% of its maximum range yielding a immunity to stage decoupling for c/T less than 0.35.

Such a feed forward oscillator architecture according to various embodiments of the invention provides distinct advantages over conventional ring oscillator architectures:

The frequency of a feed forward oscillator is higher then can be achieved by a similar ring oscillator without feed forward paths Each stage of the feed forward oscillator does not require an additional delay element.

Small tuning range (one octave or smaller tuning range).

High noise suppression from "averaging" effect.

Small layout footprint.

Three passive elements to control three key oscillator parameters.

Power requirements the same as a standard four stage ring oscillator.

Differential nature of feed forward oscillator suppresses common mode noise.

Having described several embodiments of the invention, there are alternative embodiments which may be used that perform in a similar manner. For example, some of these various alternatives include, but are not limited to the alternatives 301, 401 shown in FIGS. 3–4, respectively, each of which is a modification of the circuit shown and FIG. 2, and each may function as a stage of the feed forward oscillator shown in FIG. 1.

Figure 3:
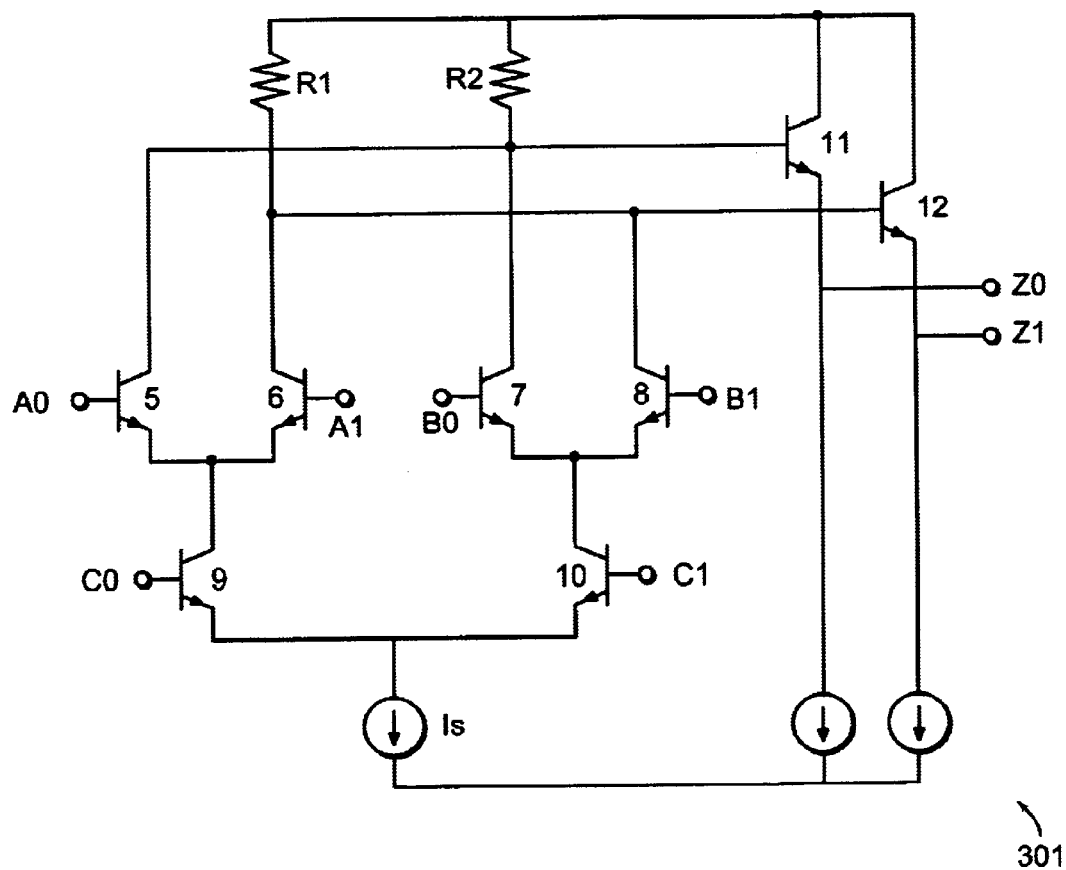
FIG. 3 is a schematic diagram showing an alternative circuit detail of one of the stages of an oscillator according to one embodiment of the invention.

Alternative A (item 301 as shown in FIG. 3): From FIG. 2, the resistors R3, R4, R5, and R6; the capacitor C1, and the transistors, Q1, Q2, Q3, and Q4, can be removed without affecting the underlying functionality of the ring oscillator system. Any combination of the above elements can be included to adjust the performance.

Figure 4:
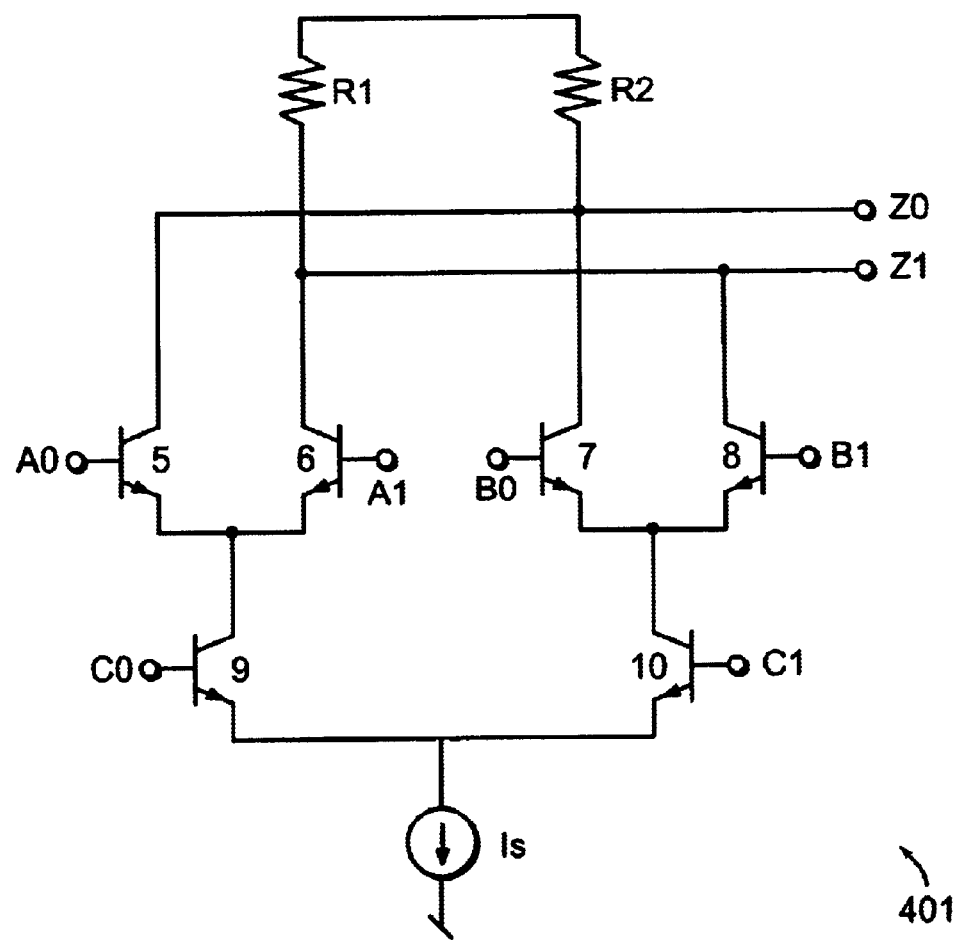
FIG. 4 is a schematic diagram showing an alternative circuit detail of one of the stages of an oscillator according to one embodiment of the invention.

Alternative B (item 401 as shown in FIG. 4): If the common base amplifiers are removed then the emitter followers can also be removed without adversely effecting the functionality.

Possible Uses

This oscillator architecture according to various aspects of the invention may be used in communication circuits where multi-phase, and high speed are required. The lower noise of the feed forward architecture also makes this architecture attractive as compared to similar ring oscillators. Oscillators are found in many applications including microprocessors, phase lock loops, digital signal processors, and frequency synthesizers. Each of these applications can benefit from various aspects of the invention.

A feed forward oscillator according to various embodiments of the invention may be used in conjunction with a symmetric multiplexer as part of a communication system as described in the patent application filed Sep. 12, 2001 entitled "SYMMETRIC MULTIPLEXER", by T. Krawcyzk, J. McDonald, and M. Ernest, Attorney Docket Number R00434/70010, incorporated by reference in its entirety. For example, an FFI VCO according to various aspects of the invention may be combined with a symmetric multiplexer that has input and output symmetry guaranteeing the same delay from any input to the output. A top-level architecture of a communication circuit integrates the FFI VCO and multiplexer creating a quarter frequency scheme capable of running as fast as, for example, 22 Gb/s. SiGe HBT technology with a 50 GHz frequency may be used to create such a communication circuit.

Having thus described various illustrative embodiments of the invention, additional modifications and improvements will readily occur to those skilled in the art and are intended to be within the scope of the invention. Accordingly, the foregoing description and drawings are by way of example only, and they are not intended to be limiting. Thus, the breadth and scope of the present invention are not limited by any of the above-described embodiments, but are defined only in accordance with the following claims and their equivalents.

What is claimed is:

1. An oscillator, comprising:

a plurality of buffer stages, each of which having an output that is coupled to inputs of at least two respective buffer stages of the plurality of buffer stages and wherein at least a first one of the plurality of buffer stages is configured and arranged to receive at a first input node a first input signal from a first output node of a first previous buffer stage and to receive at a second input node a second input signal from a second output node of a second previous buffer stage, the first and second output nodes being disposed at identical locations within identical output circuitry of the first and second previous buffer stages, and the first and second input signals being subject to substantially the same delay between the first and second output nodes and the first and second input nodes, respectively, the first one of the plurality of buffer stages being further configured to have a transition time that is determined at least in part by a weighted sum of the first and second input signals from the first and second previous buffer stages, the first one of the plurality of buffer stages comprising a differential control circuit having a pair of control inputs configured and arranged to receive a variable control voltage thereacross, the differential control circuit being configured and arranged to reject common-mode voltages on the pair of control inputs and to alter a weighting given by the first one of the plurality of buffer stages between the first and second input signals in response to changes in the variable control voltage, wherein the differential control circuit comprises a differential pair of transistors configured and arranged to receive the variable control voltage between its control nodes, and, in response to the differential control voltage, to steer a shared current between a first circuit and a second circuit, the first and second circuits being configured and arranged to cause the first one of the plurality of buffer stages to be responsive to the first and second signals, respectively, in proportion to the amount of current steered thereto.

2. The oscillator of claim 1, wherein each of the plurality of buffer stages is configured and arranged to receive inputs from two different previous buffer stages and to have a transition time that is determined at least in part by a weighted sum of the inputs from those two different previous buffer stages, and comprises a respective differential control circuit having a pair of control inputs configured and arranged to receive the variable control voltage, each differential control circuit being configured and arranged to reject common-mode voltages on its pair of control inputs and to alter a weighting given by its buffer stage between the inputs from the two different previous buffer stages provided thereto in response to changes in the variable control voltage.

3. The oscillator of claim 1, wherein the oscillator comprises at least four buffer stages.

4. The oscillator of claim 1, wherein the first one of plurality of buffer stages is configured and arranged such that an adjustment of the weighting given by the first one of the plurality of buffer stages between the first input signal from the first previous buffer stage and the second input signal from the second previous buffer stage produces an adjustment in output frequency of the oscillator.

5. The oscillator of claim 1, wherein the differential control circuit is configured and arranged such that, when the variable control voltage is varied, the proportionality of weighting between the first input signal from the first previous buffer stage and the second input signal from the second previous buffer stage is adjusted.

6. A method of controlling a frequency of an oscillator, the oscillator comprising a plurality of buffer stages, each of the buffer stages having an output that is coupled to inputs of at least two other buffer stages, at least one of the plurality of buffer stages being configured and arranged to receive at first and second input nodes first and second signals from first and second output nodes of first and second buffer stages, respectively, upstream from the at least one of the plurality buffer stages, the first and second output nodes being disposed at identical locations within identical output circuitry of the first and second buffer stapes and the first and second signals being subject to substantially the same delay between the first and second output nodes and the first and second input nodes, respectively, the at least one of the plurality of buffer stages being further configured to have a transition time that is determined at least in part by a weighted sum of the first and second signals, and further comprising a differential control circuit, having a pair of control inputs configured and arranged to receive a variable control voltage thereacross, the differential control circuit being configured and arranged to reject common-mode voltages on the pair of control inputs and to alter a weighting given by the at least one of the plurality of buffer stages between the first and second signals in response to changes in the variable control voltage, the method comprising:

adjusting the control voltage applied across the pair of control inputs of the differential control circuit to alter the weighting given by the at least one of the plurality of buffer stages between the first and second signals.

7. The method of claim 6, wherein the differential control circuit comprises a differential pair of transistors configured and arranged to receive the control voltage between its control nodes and to steer a shared current between a first circuit and a second circuit, the first and second circuits being configured and arranged to cause the at least one of the plurality of buffer stages to be responsive to the first and second signals, respectively, in proportion to the amount of current steered thereto, and the step of adjusting the control voltage comprises:

adjusting the control voltage to alter the steering of current between the first circuit and the second circuit.

8. The oscillator of claim 1, wherein:

the differential pair of transistors comprises a pair of bipolar transistors; and the differential control circuit further comprises resistors coupled between a source of the shared current and emitters of the bipolar transistors.

9. The oscillator of claim 8, wherein the differential control circuit further comprises resistors coupled between a source of the shared current and the first and second circuits, in parallel with respective ones of the pair of bipolar transistors.

10. The oscillator of claim 1, wherein the differential control circuit further comprises resistors coupled between a source of the shared current and the first and second circuits, in parallel with respective ones of the differential pair of transistors.

11. The oscillator of claim 1, wherein:

the first circuit comprises a first differential amplifier that is configured and arranged to reject common-mode voltages on its inputs; and the second circuit comprises a second differential amplifier that is configured and arranged to reject common-mode voltages on its inputs.

12. The oscillator of claim 11, wherein:

the first differential amplifier comprises a first differential pair of transistors driven by the current steered to the first circuit by the differential control circuit; and the second differential amplifier comprises a second differential pair of transistors driven by the current steered to the second circuit by the differential control circuit.

13. The oscillator of claim 12, further comprising:

a first common-base amplifier coupled to output nodes of the first differential pair of transistors; and a second common-base amplifier coupled to output nodes of the second differential pair of transistors.

14. The oscillator of claim 13, further comprising:

a pair of emitter followers coupled to summed outputs of the first and second common-base amplifiers.

15. The oscillator of claim 9, wherein:

the first circuit comprises a first differential amplifier that is configured and arranged to reject common-mode voltages on its inputs; and the second circuit comprises a second differential amplifier that is configured and arranged to reject common-mode voltages on its inputs.

16. The oscillator of claim 15, wherein:

the first differential amplifier comprises a first differential pair of transistors driven by the current steered to the first circuit by the differential control circuit; and the second differential amplifier comprises a second differential pair of transistors driven by the current steered to the second circuit by the differential control circuit.

17. The oscillator of claim 15, further comprising:

a first common-base amplifier coupled to output nodes of the first differential pair of transistors; and a second common-base amplifier coupled to output nodes of the second differential pair of transistors.

18. The oscillator of claim 17, further comprising:

a pair of emitter followers coupled to summed outputs of the first and second common-base amplifiers.

* * * * *